United States Patent [19]
Kirihata

[11] Patent Number: 5,360,984
[45] Date of Patent: Nov. 1, 1994

[54] IGBT WITH FREEWHEELING DIODE

[75] Inventor: Fumiaki Kirihata, Kanagawa, Japan

[73] Assignee: Fuji Electric Co., Ltd., Kanagawa, Japan

[21] Appl. No.: 953,268

[22] Filed: Sep. 30, 1992

[30] Foreign Application Priority Data

Nov. 29, 1991 [JP] Japan .................. 3-315691

[51] Int. Cl.$^5$ .............. H01L 27/02; H01L 27/102; H01L 29/91
[52] U.S. Cl. ................ 257/143; 257/139; 257/161; 257/140
[58] Field of Search ........ 257/140, 139, 143, 161, 257/175, 138

[56] References Cited

U.S. PATENT DOCUMENTS

| 4,742,382 | 5/1988 | Jaecklin | 257/140 |
| 4,791,470 | 12/1988 | Shinohe et al. | 257/140 |
| 5,047,824 | 9/1991 | Tokunoh et al. | 257/140 |
| 5,162,876 | 11/1992 | Kitagawa et al. | 257/143 |

FOREIGN PATENT DOCUMENTS 0143259 6/1985 European Pat. Off. .
1529050 10/1978 United Kingdom .

Primary Examiner—Rolf Hille
Assistant Examiner—Wael Fahmy
Attorney, Agent, or Firm—Finnegan, Henderson, Farabow, Garrett & Dunner

[57] ABSTRACT

A semiconductor device comprises a semiconductor substrate of a first conductive type with a low impurity density; a first region of a second conductive type; a second region of the first conductive type with a high impurity density formed in a surface of the first region; a third region of the second conductive type with a high impurity density; a gate insulating film formed on the surface of the first region intervening between an exposed surface of the semiconductor substrate and the second region; a gate electrode formed on the gate insulating film; a fourth region of the second conductive type opposite to the first region on the other surface of the semiconductor substrate; a fifth region of the first conductive type with a high impurity density which is opposite to the third region and adjacent to the fourth region; a first electrode commonly brought into contact with the first and second regions; a second electrode brought into contact with the second region and connected to the first electrode; and a third electrode commonly brought into contact with the fourth and fifth regions.

8 Claims, 3 Drawing Sheets

IGBT WITH FREEWHEELING DIODE

BACKGROUND OF THE INVENTION

1. Field of the Invention

The present invention relates to a semiconductor device containing a voltage-drive type insulating gate bipolar transistor (hereinafter referred to as an IGBT) for use in a power converter such as an inverter.

2. Prior Art

A diode, which is connected in opposite to a directional semiconductor element in such a manner that the main current flowing through the directional semiconductor element flows in a reverse direction through the diode, has been known as a freewheeling diode (hereinafter referred to as an FWD).

FIG. 1 shows such an FWD and an IGBT. In an IGBT chip 10, a p well 2 is formed on one surface of an n layer 1, and n emitter layers 3 are also formed in the surface of the p well 2. A gate oxide film 5 is formed on a channel portion 4 which is in the surface of the p well 2 and intervenes between the exposure portion of the n layer 1 and the n emitter layer 3, and a gate terminal G is connected to a gate electrode 6 on the gate oxide film 5. An emitter electrode 7 is formed by an Al vacuum evaporation so as to be commonly brought in contact with the surfaces of the p well 2 and the n emitter layers 3. A collector electrode 9 is formed so as to be brought into contact with a p emitter layer 8 which is formed on the opposite surface of the n layer 1 from the emitter electrode. A p well 11 in which the n emitter layer 3 is not contained is also formed on the n layer 1, and a pad portion 12 is formed on the p well 11. Further, p-type guard rings 13 are formed on the edge portion of the IGBT chip 10, at two stages in this case, to improve a voltage blocking capability.

On the other hand, in an FWD chip 20, a p+ anode region 22 is formed on one surface of an n layer 21, and an anode electrode 23 is formed by an Al vacuum evaporation so as to be brought into contact with the surface of the p+ anode region 22. A cathode electrode 25 is formed so as to be brought into contact with an n+ region 24 which is formed on the other surface of the n layer 21. Similarly to the case of the IGBT chip 10, p-type guard rings 26 are provided on the edge portion of the n layer 21. The cathode electrode 25 of the FWD chip 20 as well as the collector electrode 9 of the IGBT chip 10 are soldered with a metal plate in a package of the chips, and connected to a common collector terminal C. On the other hand, the pad portion 12 of the IGBT chip 10 and the anode electrode 23 of the FWD chip 20 are connected to an emitter terminal E through respective Al wires 27.

In the case where both the IGBT chip 10 and the FWD chip 20 shown in FIG. 1 are deposited in one package, a gap must be provided between these two chips for providing not only an insulation distance necessary for a voltage blocking capalitity, but also a room for allowing displacement of chips at soldering and for fitting solder fillets along chip sides. Moreover, some space is required for accommodating the Al wires 27 which connect the pad portion 12 and the anode electrode 23 to the emitter terminal E. Therefore, it is difficult to arrange the IGBT chips 10 and the FWD chips 20 in a package with high packing density for obtaining a high power density. In addition, because a wiring is performed by bonding the aluminum conductor 27, an inductance in the package is increased and deviation of the inductance between the chips becomes large. Hence, it is difficult to realize high speed operation and a large turn-off current capability of the semiconductor device.

SUMMARY OF THE INVENTION

An object of the present invention is to solve the above-mentioned problems and to provide a semiconductor device having an IGBT and an FWD, which is capable of high speed operation with low inductance.

The above object has been achieved by provision of a semiconductor device, which comprises: a semiconductor substrate of a first conductivity type with a low impurity concentration; first regions of a second conductivity type formed on one surface of the semiconductor substrate; second regions of the first conductivity type with a high impurity concentration formed on the surface of the first region; a third region of the second conductivity type with a high impurity concentration formed on the one surface of the semiconductor substrate; a gate electrode formed through a gate insulating film on the surface of the first region intervening between the exposed surface of the semiconductor substrate and the second region, a fourth region of the second conductivity type formed on the other surface of the semiconductor substrate opposite to the first region; a fifth region of the first conductivity type with a high impurity concentration formed on the other surface of the semiconductor device so as to be adjacent to the fourth region and to be opposite to the third region; a first electrode which is commonly brought into contact with the first region and the second region; a second electrode which is brought into contact with the third region and connected to the first electrode; and a third electrode which is commonly brought into contact with the fourth and fifth regions. Alternatively, a sixth region of the first conductivity type with a high impurity concentration and a seventh region of the second conductivity type with a high impurity concentration may be formed on the fourth region, respectively, so that the third electrode is commonly brought into contact with the fifth, sixth and seventh regions.

In the semiconductor device thus organized, the second region and the gate electrode should not be provided on the portion of the first region which is the nearest to the third region. Further, it should be effective that some distance is provided between the first region and the third region. In this case, it is preferable that the third region surrounds the first region and guard ring regions of the second conductivity type are formed between the first and third regions. Moreover, it is effective that a distance L between a plane perpendicular to the surface of the semiconductor substrate containing the edge of the first region which is the nearest to the second region and a plane perpendicular to the surface of the semiconductor substrate containing the edge of the fifth region which is brought into contact with the fourth region is equal to or more than $40\,\tau^{\frac{1}{2}}$ in $\mu m$, where $\tau$ is in $\mu s$ and is a life time of minority carriers in the region of the original semiconductor substrate. Further, the first electrode should be connected to the second electrode by a conductor layer formed on the surface of the semiconductor substrate through an insulating film, and a conductor is connected to the second electrode for connection to the exterior.

An IGBT is constructed with the semiconductor substrate, the first region, the second region formed thereon, a gate electrode provided on the semiconductor substrate through the gate insulating film, the fourth region, the first electrode, and the third electrode, and a diode is constructed with the semiconductor substrate, the third and fifth regions formed thereon, and the second and third electrodes, in which the first electrode is connected to the second electrode. Therefore, the IGBT and the FWD are integrated in a single semiconductor substrate, thereby achieving high density of the semiconductor device. Further, because a conductor for connection between the IGBT and the FWD is omitted, inductance is reduced, and high speed operation is realized. Then, when the fourth region is connected to the third electrode through the sixth and seventh regions, the device becomes of a collector short type, which has the advantage that the efficiency of carrier injection from the fourth region to the substrate itself is lowered and the switching loss is reduced. The carrier injection from a MOS structure to a diode portion can be prevented by no provision of the MOS structure at the portion of the first region nearest to the third region, and also by provision of some distance between the first and third regions. Further, by setting a distance L between the first region and the fifth region to 40 $\tau^{\frac{1}{2}}$ or more, an interference effect of generating latch up at the IGBT portion can be prevented when a diode makes a reverse recovery. Further, by providing a guard ring between the IGBT portion and the FWD portion, a depletion layer is extended from under the first region to under the third region to ensure a voltage blocking capability.

DETAILED EMBODIMENTS OF THE PREFERRED EMBODIMENTS

Figure 1:
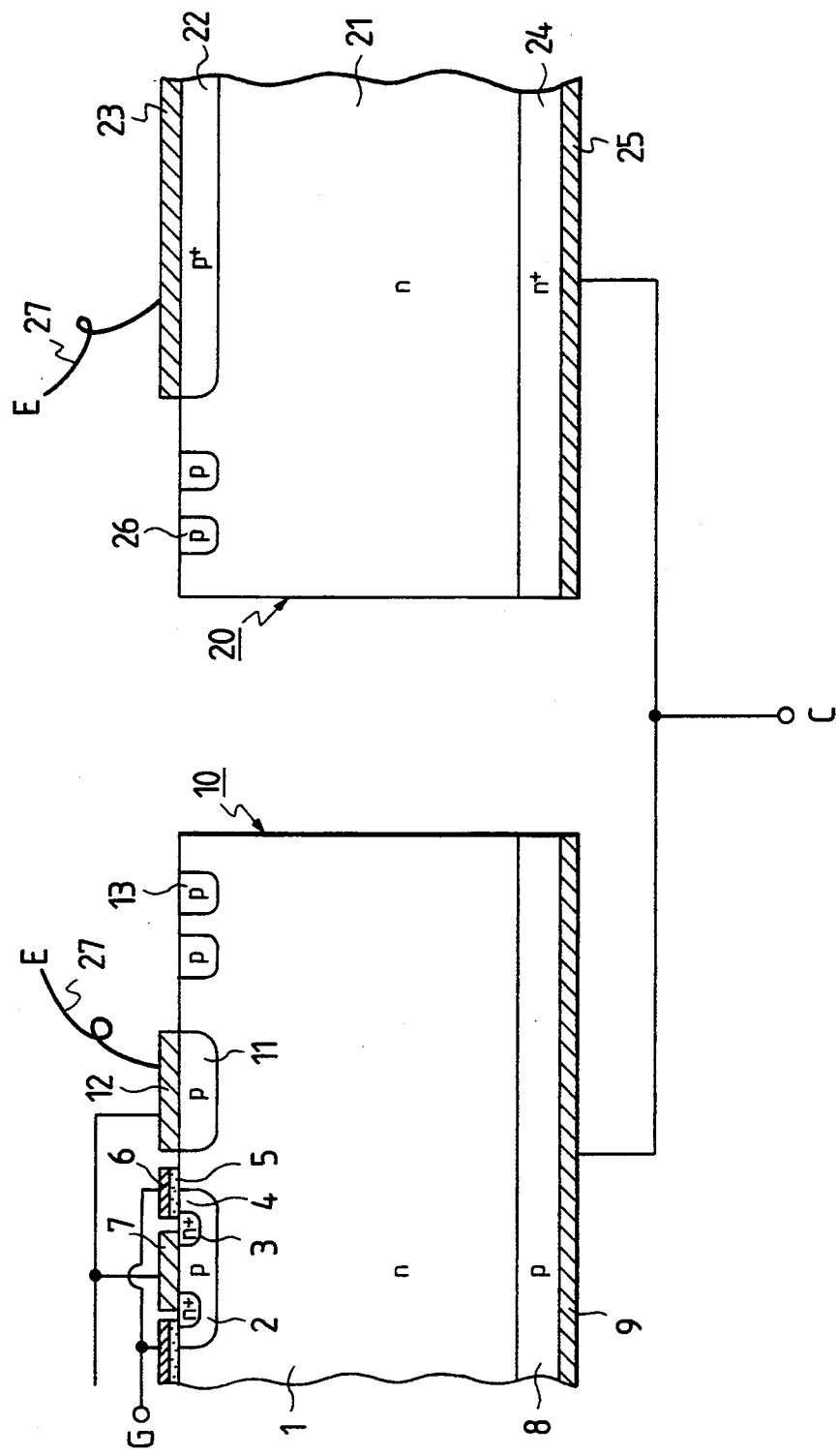
FIG. 1 is a cross section showing a conventional IGBT and FWD.
Figure 2:
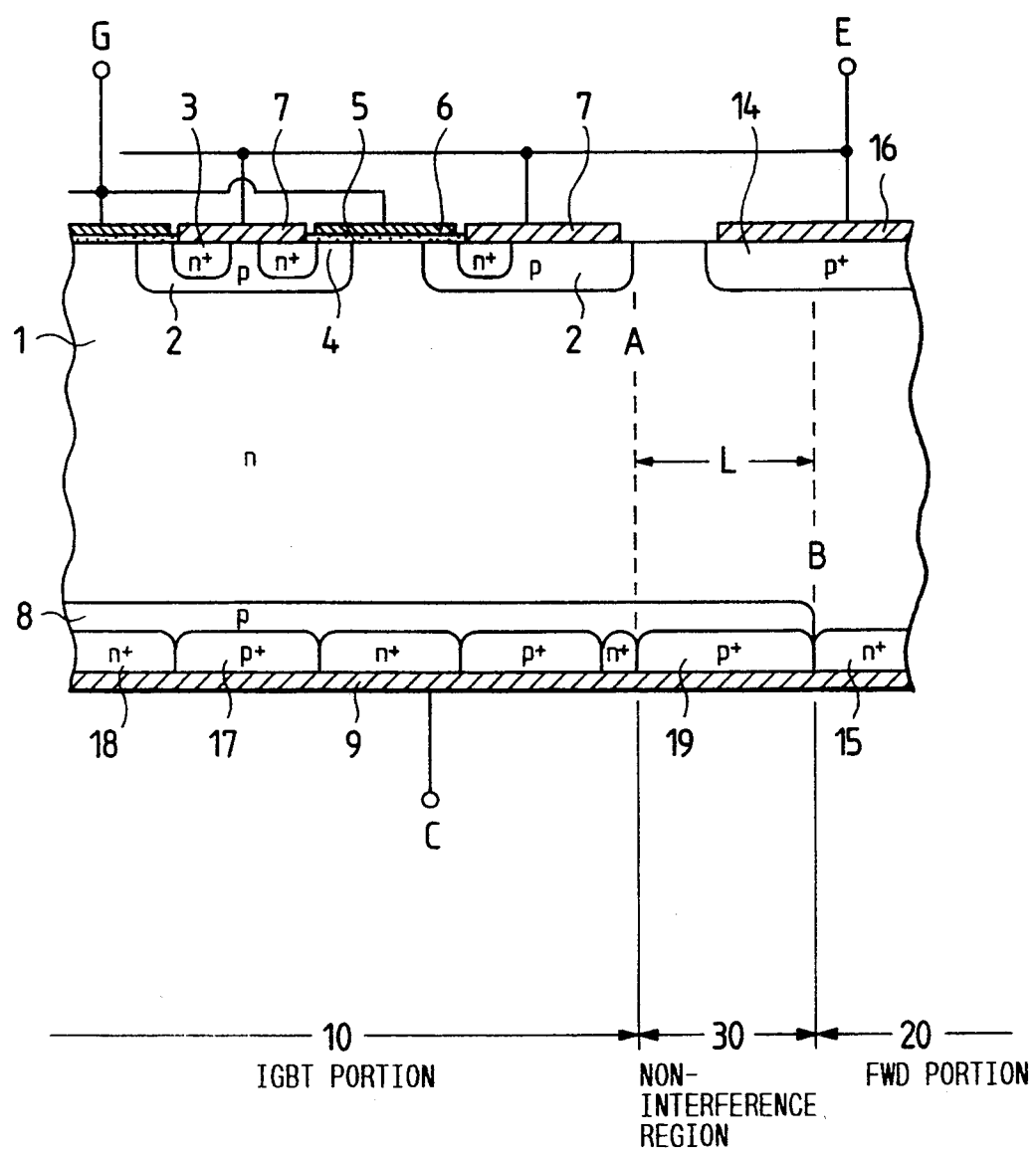
FIG. 2 is a cross section showing a reverse conducting IGBT according to one embodiment of this invention.

FIG. 2 shows a reverse conducting IGBT according to one embodiment of the present invention. The common portions as in FIG. 1 are denoted by the same numeral references.

In FIG. 2, an FWD portion 20 including a p+ anode region 14 and an n+ region 15 is formed in an n-type silicon substrate 1 which constitutes an IGBT portion 10 including a p well 2, an n emitter layer 3 and a p emitter layer 8, in the form of one chip. An emitter electrode 7 of the IGBT portion 10, an anode electrode 16 of the FWD portion 20, and a connecting portion therebetween are integrally formed by Al vacuum evaporation. The connecting portion is insulated from the silicon substrate 1 by an oxide film. The n+ emitter layer 3, a gate oxide film 5 on the surface of the substrate 1 and a gate electrode 6 on the gate oxide film 5 are not provided on a portion of the p well 2 of the IGBT portion 10 nearest to the anode region 14 of the diode so as to reduce an interference effect with the diode. Further, some distance is provided between the p well 2 and the p+ region 14 of the FWD portion.

A p emitter layer 8 is formed at the IGBT portion in the opposite surface of the silicon substrate 1. Further, a p+ region 17 and an n+ region 18 which are diffusion layers shallower than the p emitter layer 8 are alternately formed on the other surface of the silicon substrate 1. A collector electrode 9 contacts with the both regions 17 and 18 thus forming a collector short structure. That is, the existence of the n+ region 18 makes the hole injection efficiency through the p+ region 17 and the p emitter layer 8 low, thereby reducing a switching loss at a turn-off operation. In a non-interference region 30 provided between the IGBT portion 10 and the FWD portion 20, a p+ region 19 is formed on the other surface of the semiconductor substrate at the collector side so as to draw holes injected from the p+ anode region 14 of the FWD portion 20, thereby reducing the interference effects.

The n+ region 15 is formed at the same side of the silicon substrate 1 as the p+ region 19 in the FWD portion 20 acts as a cathode of the diode. A space is provided as a non-interference region 30 between a cross section B vertical to the main surface of the substrate 1 passing through the edge of the n+ region 15 and a vertical cross section A passing through the edge portion of the p well 2 in the IGBT portion 10 nearest to the FWD portion 20. When a distance L between the cross sections A and B is zero, it has been observed that such phenomenon that the IGBT was latched up on the reverse recovery of the diode. According to a simulation and an experiment, it could be found that the interference effect was not generated in the case where L in μm is under the following condition.

$$L \geq 40\ \tau^{\frac{1}{2}} \qquad (1)$$

where τ in μs is a life time of minority carriers of the n⁻ layer 1 of the diode portion. In the embodiment shown in FIG. 2, L was 90 μm. By receiving the reverse conducting IGBT chip thus organized in a package, a power density higher than the conventional device by 20% or more could be obtained.

Figure 3:
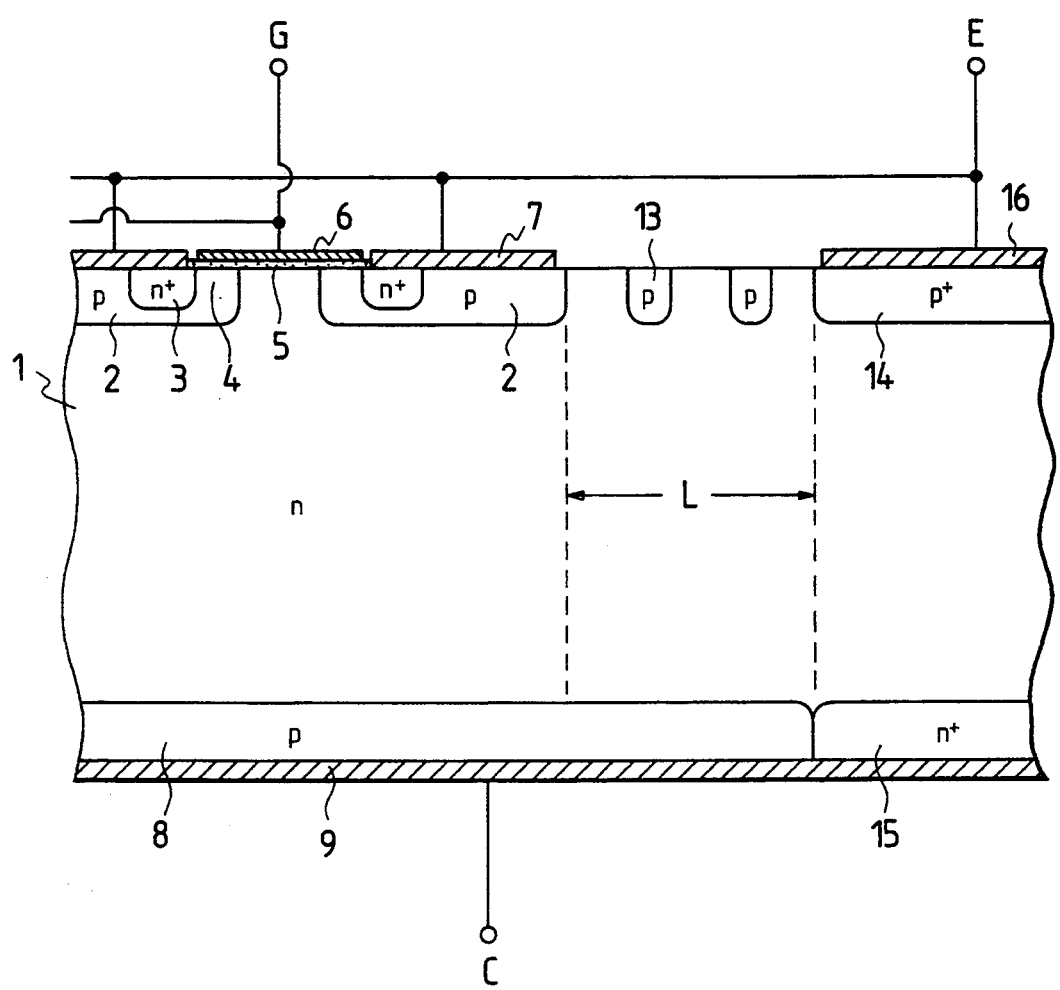
FIG. 3 is a cross section showing a reverse conducting IGBT according to another embodiment of this invention.

FIG. 3 shows a reverse conducting IGBT according to another embodiment of the present invention. In the case where a life time of an FWD portion 20 cannot be reduced, it is necessary to make L large, as is apparent from Expression (1). In this case, it is more effective in reduction of the interference effects that a p+ anode region 14 of the FWD portion 20 is separated far from an edge A of a p well 2 in an IGBT portion 10. However, when the distance therebetween becomes large, the depletion layer under the p well 2 of the IGBT portion 10 does not combine with that under the p+ anode region 14 of the FWD portion 20. Then, the depletion layers appear on the surface of the semiconductor substrate between the p well 2 and the p+ anode region 14 so that a voltage blocking capability may be lowered. In order to prevent this, p+ guard ring regions 13 are provided between the edge A of the p well 2 and the p+ region 14, as shown in FIG. 3.

As described above, since an anode electrode 16 is integrally formed with an emitter electrode 7, the connection of the anode electrode 16 with an emitter terminal E is performed by bonding an Al wire, using the anode electrode 16 as a pad portion. In order to obtain a lower inductance due to wiring, it is effective to connect an electrode plate to the anode electrode 16 by fusion or pressure connection, and also at the same time, it is preferable to connect an electrode plate to a collector 9 at the other surface of the semiconductor substrate 1.

According to the present invention, an IGBT chip and an FWD chip are formed into a single chip to provide a reverse conducting IGBT. As a result, a gap between these two chips becomes unnecessary. Also, because an emitter electrode of the IGBT and a main electrode of the FWD are integrally formed, it is unnecessary to connect both electrodes through a wiring, thereby being capable of a non-interference inductance wiring between the IGBT portion and the FWD portion.

Further, a non-interference region is provided between the IGBT portion and the FWD portion so that the IGBT is prevented from being latched up by change of voltage or current at the reverse recovery of the diode. Consequently, a semiconductor device for a power converter device with a low inductance and a high power density could be realized.

What is claimed is:

1. A semiconductor device, comprising:
    a semiconductor substrate of a first conductive type with a low impurity density;
    a first region of a second conductive type formed on one surface of said semiconductor substrate;
    a second region of said first conductive type with a high impurity density formed on the surface of said first region;
    a third region of said second conductive type with a high impurity density formed on one surface of said semiconductor substrate;
    a gate insulating film formed on the surface of said first region intervening between an exposed surface of said semiconductor substrate and said second region;
    a gate electrode formed on said gate insulating film;
    a fourth region of said second conductive type formed on the other surface of said semiconductor substrate opposite to said first region;
    a fifth region of said first conductive type with a high impurity density which is opposite to said third region and adjacent to said fourth region;
    a first electrode commonly brought into contact with said first and second regions;
    a second electrode brought into contact with said third region and connected to said first electrode; and
    a third electrode commonly brought into contact with said fourth and fifth regions;
    wherein a plane perpendicular to a surface of said semiconductor substrate and including an edge of said first region nearest to said third region, and another plane perpendicular to a surface of said semiconductor substrate including an edge of said fifth region brought into contact with said fourth region are spaced by a distance equal to or more than $40\,\tau^{\frac{1}{2}}$ in $\mu m$ wherein $\tau$ is in $\mu s$ and is a life time of minority carriers in said semiconductor substrate.

2. A semiconductor device, comprising:
    a semiconductor substrate of a first conductive type with a low impurity density;
    a first region of a second conductive type formed on one surface of said semiconductor substrate;
    a second region of said first conductive type with a high impurity density formed on the surface of said first region;
    a third region of said second conductive type with a high impurity density formed on one surface of said semiconductor substrate;
    a gate insulating film formed on the surface of said first region intervening between an exposed surface of said semiconductor substrate and said second region;
    a gate electrode forked on said gate insulating film;
    a fourth region of said second conductive type formed on the other surface of said semiconductor substrate opposite to said first region;
    a fifth region of said first conductive type with a high impurity density which is opposite to said third region and adjacent to said fourth region;
    a sixth region of said first conductive type with a high impurity density formed on a surface of said fourth region;
    a seventh region of said second conductive type with a high impurity density formed on the surface of said fourth region;
    a first electrode commonly brought into contact with said first and second regions;
    a second electrode brought into contact with said third region and connected to said first electrode; and
    a third electrode commonly brought into contact with said fifth, sixth and seventh regions;
    wherein a plane perpendicular to a surface of said semiconductor substrate and including an edge of said first region nearest to said third region, and another plane perpendicular to a surface of said semiconductor substrate and including an edge of said fifth region brought into contact with said fourth region are spaced by a distance equal to or more than $40\,\tau^{\frac{1}{2}}$ in $\mu$ wherein $\tau$ is in $\mu s$ and is a life time of minority carriers in said semiconductor substrate.

3. A semiconductor device as claimed in claim 1 or 2, wherein said second region and said gate electrode are not provided in a portion of said first portion nearest to said third region.

4. A semiconductor device as claimed in claim 1 or 2, wherein a distance is provided between said first and third regions.

5. A semiconductor device as claimed in claim 4, further comprising a guard ring region of said second conductive type provided between said first and third regions, wherein said third region surrounds said first region.

6. A semiconductor device as claimed in claim 1 or 2, wherein said first and second electrodes are connected by a conducting layer with an insulating film formed between said semiconductor substrate and said conducting layer, and a conductor is coupled with said second electrode for connection to an exterior.

7. A semiconductor device, comprising:
    a semiconductor substrate of a first conductive type with a low impurity density;
    a first region of a second conductive type formed on one surface of said semiconductor substrate;
    a second region of said first conductive type with a high impurity density formed on the surface of said first region;
    a third region of said second conductive type with a high impurity density formed on one surface of said semiconductor substrate;
    a gate insulating film formed on the surface of said first region intervening between an exposed surface of said semiconductor substrate and said second region;
    a gate electrode formed on said gate insulating film;

a fourth region of said second conductive type formed on the other surface of said semiconductor substrate opposite to said first region;

a fifth region of said first conductive type with a high impurity density which is opposite to said third region and adjacent to said fourth region;

a first electrode commonly brought into contact with said first and second regions;

a second electrode brought into contact with said third region and connected to said first electrode; and a third electrode commonly brought into contact with said fourth and fifth regions; and wherein said second region and said gate electrode are excluded in a portion of said first region nearest to said third region.

8. A semiconductor device, comprising:

a semiconductor substrate of a first conductive type with a low impurity density;

a first region of a second conductive type formed on one surface of said semiconductor substrate;

a second region of said first conductive type with a high impurity density formed on the surface of said first region;

a third region of said second conductive type with a high impurity density formed on one surface of said semiconductor substrate;

a gate insulating film formed on the surface of said first region intervening between an exposed surface of said semiconductor substrate and said second region;

a gate electrode formed on said gate insulating film;

a fourth region of said second conductive type formed on the other surface of said semiconductor substrate opposite to said first region;

a fifth region of said first conductive type with a high impurity density which is opposite to said third region and adjacent to said fourth region;

a sixth region of said first conductive type with a high impurity density formed on a surface of said fourth region;

a seventh region of said second conductive type with a high impurity density formed on the surface of said fourth region;

a first electrode commonly brought into contact with said first and second regions;

a second electrode brought into contact with said third region and connected to said first electrode; and a third electrode commonly brought into contact with said fifth, sixth and seventh regions; and wherein said second region and said gate electrode are excluded in a portion of said first region nearest to said third region.

* * * * *